US006864108B1

United States Patent
Papa Rao et al.

(10) Patent No.: US 6,864,108 B1
(45) Date of Patent: Mar. 8, 2005

(54) MEASUREMENT OF WAFER TEMPERATURE IN SEMICONDUCTOR PROCESSING CHAMBERS

(75) Inventors: Satyavolu S. Papa Rao, Garland, TX (US); Stephan Grunow, Dallas, TX (US); Noel M. Russell, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/689,218

(22) Filed: Oct. 20, 2003

(51) Int. Cl.$^7$ ............................. H01L 21/00; G01K 7/36
(52) U.S. Cl. ......................................... 438/14; 374/183
(58) Field of Search ................................. 438/5, 10, 14, 438/17; 374/114, 120, 163, 183–185; 702/130; 324/71.1, 71.5

(56) References Cited

U.S. PATENT DOCUMENTS

| | | | | |
|---|---|---|---|---|
| 3,707,873 A | * | 1/1973 | Young | 331/66 |
| 4,095,469 A | * | 6/1978 | Yamada et al. | 374/120 |
| 4,799,046 A | * | 1/1989 | Heinen | 340/595 |
| 5,354,130 A | * | 10/1994 | Seppa et al. | 374/175 |
| 5,477,035 A | * | 12/1995 | Matsumoto et al. | 219/635 |

* cited by examiner

*Primary Examiner*—Evan Pert
(74) *Attorney, Agent, or Firm*—Peter K. McLarty; W. James Brady, III; Frederick J. Telecky, Jr.

(57) ABSTRACT

A coil (50) is placed adjacent to a semiconductor wafer (10). An AC excitation current is used to create a changing electromagnetic field (60) is the wafer (10). The wafer is heated by a heat source (20) and the conductivity of the wafer (10) will change as a function of the wafer temperature. Induced eddy currents will cause the inductance of the coil (50) to change and the temperature of the wafer (10) can be determined by monitoring the inductance of the coil (50).

22 Claims, 2 Drawing Sheets

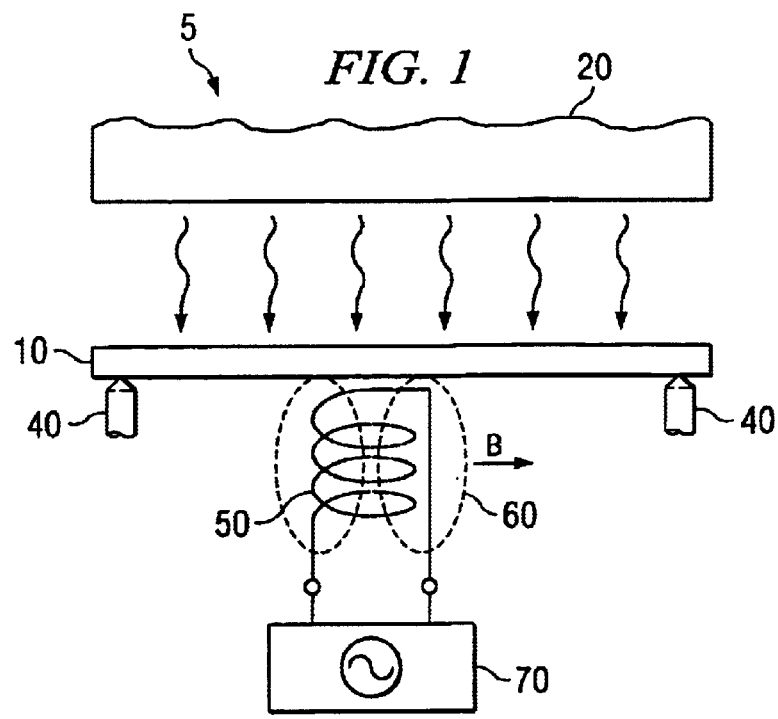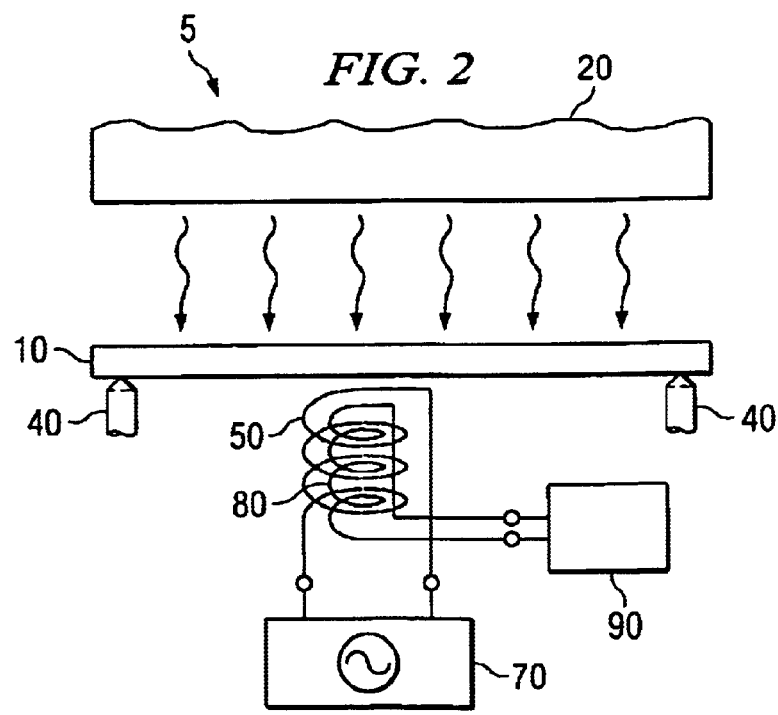

US 6,864,108 B1

MEASUREMENT OF WAFER TEMPERATURE IN SEMICONDUCTOR PROCESSING CHAMBERS

FIELD OF THE INVENTION

The invention is generally related to the field of semiconductor processing and more specifically to method and apparatus for measuring the temperature of a semiconductor wafer during wafer processing.

BACKGROUND OF THE INVENTION

The processing of semiconductor wafers to form integrated circuits often requires a precise control of temperature. As device dimensions are reduced the control of the wafer temperature during processing is becoming a more critical component in maintaining high integrated circuit manufacturing yields. In particular with the increased use of ultra-low K (ULK) dielectrics, wafer-degas processing and temperature control are becoming more critical. Rapid and reliable wafer temperature measurement is currently not available in lamp-heated degas chambers.

A number of methods are currently being used to obtain the semiconductor wafer temperature during processing. Thermocouples built-in to the tools are often used but are usually not in direct contact with the wafer. This can lead to temperature differences of as much as 50° C. during temperature transients. In addition, the built-in thermocouple is often affected by emissivity variation in the system. Dummy wafers with thermocouples built-in to the wafer are used but are very cumbersome and not suitable for in-situ temperature measurements during single wafer processing. Temperatures measurements made using wafers carrying CMOS-based temperature-sensor arrays are limited to temperatures less than 150° C. by the battery, the battery life, and the circuitry required for such measurements.

Current single wafer manufacturing tools pose special problems in obtaining accurate and reproducible temperature measurements. The pyrometers used in a vast majority of such systems are affected by emissivity variations that introduce inaccuracies in the temperature measurement.

There is therefore a need for a rapid reliable wafer temperature measurement apparatus and method. The instant invention addresses this need.

SUMMARY OF THE INVENTION

An apparatus and method for measuring the temperature of a semiconductor wafer is provided. A first coil is placed in a semiconductor processing tool and connected to an electronic apparatus. A semiconductor wafer is mounted in the semiconductor tool and held in place by mounts in close proximity to the first coil. Alternating current is supplied to the first coil through the electronic apparatus and an electromagnetic field is induced in the semiconductor wafer. As the temperature of the wafer is varied the wafer conductance will change. The change in the conductance of the wafer will cause the inductance of the coil to change through induced eddy currents. The temperature of the semiconductor wafer can then be determined from the measured inductance of the first coil.

In an embodiment of the instant invention, a second coil is positioned adjacent to the first coil. In this embodiment the temperature of the wafer is determined by measuring the electromotive force (emf) induced in the second coil.

In a further embodiment of the instant invention a first coil is placed in an enclosure adjacent to a first material that possesses a temperature dependent conductivity. The first material is placed in thermal contact with a piece whose temperature is to be determined. An electronic apparatus is connected to the first coil and used to supply an AC excitation and monitor the inductance of the first coil. A second coil can be placed in the enclosure adjacent to the first coil and the emf induced in the second coil can be measured to determine the temperature of the piece.

BRIEF DESCRIPTION OF THE DRAWINGS

In the drawings:

FIG. 1 is a schematic diagram showing an embodiment of the instant invention.

FIG. 2 is a schematic diagram showing a dual coil embodiment of the instant invention.

Figure 3:
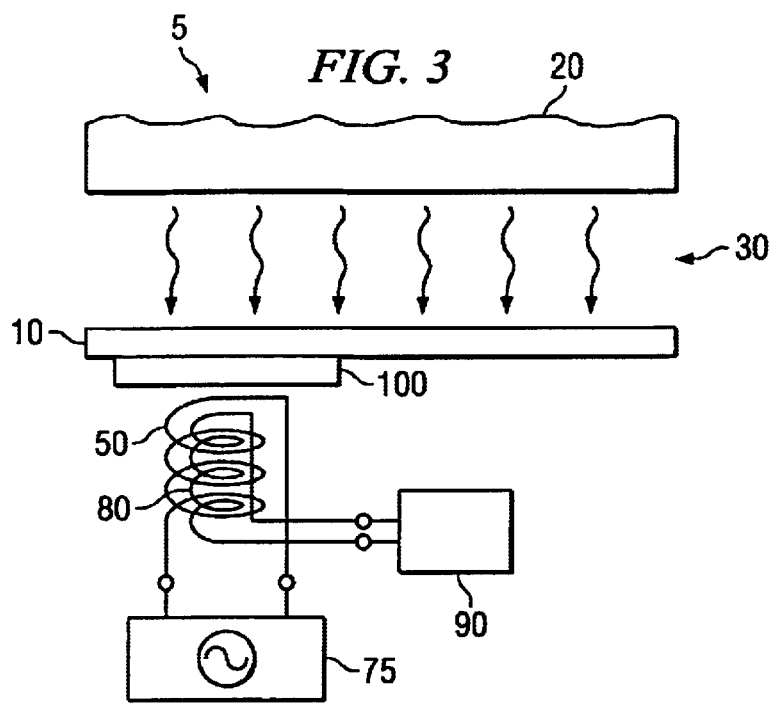
FIG. 3 is a schematic diagram showing a further embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–4, the instant invention can be utilized in any temperature measurement configuration. The methodology of the instant invention provides an improved apparatus and method for obtaining the temperature of a semiconductor wafer during processing.

Shown in FIG. 1 is a schematic diagram of a wafer temperature measuring apparatus according to an embodiment of the instant invention. A semiconductor wafer 10 is placed in a semiconductor processing tool 5. Various components of the semiconductor processing tool have been omitted from all the Figures for clarity. The semiconductor wafer 10 is held in place by wafer mounts 40 and is heated using a heat source 20. The wafer mounts 40 are depicted in FIG. 1 as pins but the instant invention is intended to encompass any method of holding the wafer 10 in place during processing. The heat source 20 represents any method for heating the wafer during processing including resistive coils and heating using lamps that emit light of certain specified wavelengths such as tungsten halogen lamps. The heat source 20 is placed above the wafer 10 in FIG. 1 for illustrative purposes only. The heat source 20 can be placed in any position where it effectively heats the wafer. A coil 50 is positioned in close proximity to the wafer 10 and is connected to electronic apparatus 70 comprising an alternating current (AC) excitation source. In addition to an AC excitation source, the electronic apparatus 70 also comprises electronic circuits for measuring the changes in the properties of the coil 50 such as coil inductance. The coil 50 comprises any number of loops of a metal wire. In general, fluctuating electromagnetic fields 60 will be created in the wafer 10 by passing an alternating current through the coil 50. The coil 50 can also be energized by an (AC) excitation source operating in a "constant-current" mode, ensuring the constancy of the magnetic field independent of the coil resistance. The fluctuating electromagnetic fields created by the coil 50 induce eddy currents in the wafer 10 which perturb the applied field and change the inductance $X_C$ of the coil 50. The resulting change in the impedance Z of the electronic circuits connected to the coil 50 can be measured by the electronic apparatus 70. The measured change in the impedance Z of the electronic circuit connected to the coil can-be related to a number of factors including the change in the electrical conductivity σ of the wafer 10 as a function of temperature. The effect of eddy currents and the change in inductance of a coil is described in an article by J. P. Wallace et al. in J. Applied Physics 69 (1991), 550 which is hereby incorporated by reference.

The conductivity of a semiconductor can be described in a general way as σ=q($\mu_n$n+$\mu_p$p), where $\mu_n$ is the electron mobility, $\mu_p$ the hole mobility, n the electron concentration, p the hole concentration, and q the fundamental electronic charge. In general $\mu_n$, $\mu_p$, n, and p will have temperature dependencies that are known or can be measured. Therefore the relationship of conductivity σ as a function of wafer temperature can be established (i.e. σ=f(T) where T is wafer temperature). As the temperature of the wafer changes during processing the conductivity σ of the wafer will change according to the known function. This change in the conductivity σ of the wafer 10 will cause the measured impedance Z of the electronic circuit 70 to change as the wafer temperature changes. Using the known relationship between the measured impedance Z and the conductivity σ of the wafer, the temperature of the wafer can be determined. For wafers that comprise silicon this results in a usable temperature measurement system for measuring temperatures greater than ~200° C. Using mathematical notation the measured impedance Z can be given by Z=f($T_W$) where $T_W$ is the wafer temperature.

Shown in FIG. 2 is an embodiment of the instant invention comprising a secondary coil 80. As shown in FIG. 2, the coil 50 to which the AC excitation current is applied surrounds a secondary coil 80. It should be noted that the secondary coil 80 can be placed in any position relative to the excited coil 50. The only requirement for the position of the secondary coil 80 is that is eddy currents set up by the excited coil 50 induce an electromotive force in the secondary coil 80. The secondary coil 80 comprises any number of turns of a metal wire. For high wafer temperatures, the resistance of the coil 50 changes with temperature and contributes an impedance change that could be mistaken for that associated with inductive effects. To account for the temperature dependence of the impedance of the coil 50, the secondary coil 80 is employed. In this embodiment, the coil 50 is used to excite eddy currents in the wafer 10, and the (temperature dependent) current used to excite them is monitored. The eddy currents create a secondary electromagnetic field which perturbs the field created by the coil 50. The electromotive force (emf) induced in the secondary coil 80 can be measured using a high impedance voltmeter 90. The emf measured in the secondary coil 80 is proportional to the conductivity of the wafer. Using the temperature dependence of the wafer conductivity, the measured emf in the secondary coil 80 can be used to determine the wafer temperature. The effect of eddy currents and emf induced in a secondary coil is described in an article by H. N. B. Wadley et al. in the J. Crystal Growth 130 (1993), 553 which is hereby incorporated by reference.

A further embodiment of the instant invention is shown in FIG. 3. As shown in FIG. 3, a second semiconductor 100 is placed in thermal contact with the semiconductor wafer 10. The wafer 10 is heated using the heat source 20 as described above. The wafer 10 will heat the second semiconductor 100 to a temperature that is approximately equal to the wafer temperature. The excited coil 50 and the secondary coil 80 are placed in close proximity to the second semiconductor 100. The inductance of an electronic circuit 75 connected to the excited coil 50 and the induced emf in the secondary coil 80 will both be dependent on the conductivity of the second semiconductor 100. Using the temperature dependence of the conductivity of the second semiconductor 100, the temperature of the second semiconductor 100 can be determined from the measured inductance and/or the measured induced emf. The temperature of the wafer 10 will then be approximately equal to the measured temperature of the second semiconductor 100. The induced emf in the secondary coil 80 is measured using the electronic system 90. The second semiconductor 100 can be any semiconductor with a temperature dependent conductivity. In particular the second semiconductor can comprise any semiconductor from Group IV of the periodic table: Silicon, Germanium (Ge); from compound semiconductors made from Group III & Group V such as: Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), and III–V alloys such as AlGaAs, InGaAsP, GaAsP, AlGaN. In addition semiconductors made from Group II and Group VI such as Zinc Selenide (ZnSe), Zinc Telluride (ZnTe), Cadmium Telluride (CdTe), Zinc Sulphide (ZnS), Mercury Telluride (HgTe) and their alloys HgCdTe (Mercury Cadmium Telluride) etc, can be used. Although the embodiment shown in FIG. 3 comprises both an excited coil 50 and a secondary coil 80, the use of the secondary coil is optional and the temperature of the wafer 10 can be determined using the measured inductance of an electronic circuit connected to the excited coil 50 without the presence of the secondary coil 80.

Figure 4:
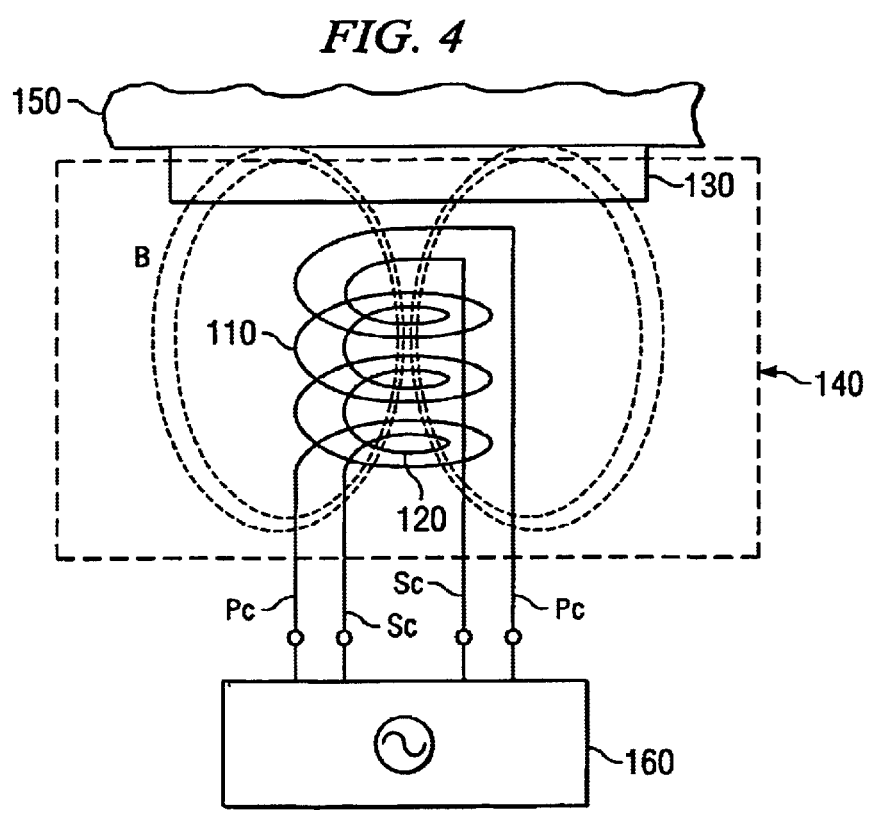
FIG. 4 is a schematic diagram showing a temperature probe according to an embodiment of the instant invention.

Shown in FIG. 4 is a thermal probe according to a further embodiment of the instant invention. A primary coil 110 is placed in an enclosure 140. An optional secondary coil 120 is placed in the enclosure 140 in close proximity to the primary coil 110. In a further embodiment the secondary coil 120 is enclosed by the primary coil 110. A first material 130 is placed in close proximity to the primary coil 110 and the optional secondary coil 120 if present. The first material 130 is a material with a temperature dependent conductivity. Any material that processes a temperature dependent conductivity that is known or can be measured is suitable for use. In a further embodiment the first material 130 can comprise a semiconductor. The semiconductor can comprise any semiconductor from Group IV of the periodic table such as Silicon, Germanium (Ge), from compound semiconductors made from Group III and Group V such as: Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), and III–V alloys such as AlGaAs, InGaAsP, GaAsP, AlGaN. In addition compound semiconductors made form Group II and group VI such as: Zinc Selenide (ZnSe), Zinc Telluride (ZnTe), Cadmium Telluride (CdTe), Zinc Sulphide (ZnS), Mercury Telluride (HgTe) and their alloys HgCdTe (Mercury Cadmium Telluride) etc, can be used. The first material 130 can be placed in the enclosure 140 adjacent to the primary coil 110 and the secondary coil 120 if present. Both the primary coil 110 and the optional secondary coil 120 are connected to an electronic system 160.

In operation the first material 130 is placed in thermal contact with the piece 150 whose temperature is to be determined. The primary coil 110 is connected to an electronic apparatus 160 comprising an alternating current (AC) excitation source. In addition to an AC excitation source, the electronic apparatus 160 also comprises electronic circuits and systems for measuring the changes in the properties of the primary coil 110 such as coil inductance. The primary coil 110 comprises any number of loops of a metal wire. In general, fluctuating electromagnetic fields 160 will be created in the material 130 by passing an alternating current through the primary coil 110. The fluctuating electromagnetic fields created by the primary coil 110 induce eddy currents in the material 130 which perturb the applied field and change the inductance $X_p$ of the primary coil 110. The resulting change in the impedance Z of the electronic circuits contained in the electronic apparatus 160 connected to the primary coil 110 can be measured by the electronic apparatus 160. The measured change in the impedance Z of the electronic circuit connected to the primary coil 110 can be related to the change in the electrical conductivity $\sigma$ of the material 130 as a function of temperature. By determining the conductivity of the first material 130, the temperature of the first material 130 can be determined. Because the first material 130 is in thermal contact with the piece 150, the temperature of the first material 130 will be approximately equal to the temperature of the piece 150 and the temperature of the piece 150 can be determined. In an embodiment where the secondary coil 120 is present, the eddy currents will induce an emf in the secondary coil that can be measured using the electronic apparatus 160. The measured emf is related to the conductivity of the first material which depends on the temperature. Measuring the emf in the secondary coil 120 therefore allows one to determine the temperature of the first material 130 and therefore the temperature of the piece.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for measuring the temperature of a semiconductor wafer, comprising:
   placing a coil adjacent a semiconductor wafer;
   flowing an AC current through said coil to create an electromagnetic field in said semiconductor wafer;
   heating said semiconductor wafer;
   monitoring an inductance of said coil; and
   determining said semiconductor wafer temperature from said inductance of said coil.

2. The method of claim 1 wherein said semiconductor wafer is placed in a semiconductor processing tool.

3. The method of claim 2 further comprising placing a first semiconductor in thermal contact with said semiconductor wafer and adjacent to said coil.

4. The method of claim 3 wherein said first semiconductor is a material from a group consisting of Silicon, Germanium (Ge), Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), AlGaAs, InGaAsP, GaAsP, AlGaN, Zinc Selenide (ZnSe), Zinc Telluride (ZnTe), Cadmium Telluride (CdTe), Zinc Sulphide (ZnS), Mercury Telluride (HgTe) and Mercury Cadmium Telluride (HgCdTe).

5. A dual coil method for measuring semiconductor wafer temperature, comprising:
   placing a first coil adjacent a semiconductor wafer;
   placing a second coil adjacent said first coil and said semiconductor wafer;
   flowing an AC current through said first coil to create an electromagnetic field in said semiconductor wafer;
   heating said semiconductor wafer;
   monitoring an electromotive force (emf) induced in said second coil; and
   determining said semiconductor wafer temperature from said emf induced in said second coil.

6. The method of claim 5 wherein said semiconductor wafer is placed in a semiconductor processing tool.

7. The method of claim 6 further comprising placing a first semiconductor in thermal contact with said semiconductor wafer and adjacent to said first coil and said second coil.

8. The method of claim 7 wherein said first semiconductor is a material from a group consisting of Silicon, Germanium (Ge), Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), AlGaAs, InGaAsP, GaAsP, AlGaN, Zinc Selenide (ZnSe), Zinc Telluride (ZnTe), Cadmium Telluride (CdTe), Zinc Sulphide (ZnS), Mercury Telluride (HgTe) and Mercury Cadmium Telluride (HgCdTe).

9. A temperature probe apparatus, comprising:
   a first coil in an enclosure;
   a second coil in said enclosure adjacent to said first coil; and
   a first material in said enclosure adjacent to said first coil and said second coil, wherein said first material possesses a temperature dependent conductivity.

10. The temperature probe apparatus of claim 9 wherein said first material is a semiconductor.

11. The temperature probe apparatus of claim 10 wherein said semiconductor is a material from a group consisting of Silicon, Germanium (Ge), Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), AlGaAs, InGaAsP, GaAsP, AlGaN, Zinc Selenide (ZnSe), Zinc Telluride (ZnTe), Cadmium Telluride (CdTe), Zinc Sulphide (ZnS), Mercury Telluride (HgTe) and Mercury Cadmium Telluride (HgCdTe).

12. The temperature probe apparatus of claim 9 further comprising an AC excitation source connected to said first coil and an apparatus for measuring induced electromotive force connected to said second coil.

13. A method for temperature measurement, comprising:
   placing a first coil in an enclosure;
   placing a second coil in said enclosure adjacent to said first coil;
   placing a first material in said enclosure adjacent to said first coil and said second coil, wherein said first material possesses a temperature dependent conductivity;
   placing said first material against a piece whose temperature is to be measured;
   flowing an AC current through said first coil to produce an electromagnetic field in said first material;
   measuring an electromotive force (emf) induced in said second coil; and
   determining a temperature of said piece.

14. The method of claim 13 wherein said first material is a semiconductor.

15. The method of claim 14 wherein said semiconductor is a material from a group consisting of Silicon, Germanium (Ge), Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), AlGaAs, InGaAsP, GaAsP, AlGaN, Zinc Selenide (ZnSe), Zinc Telluride (ZnTe), Cadmium Telluride (CdTe), Zinc Sulphide (ZnS), Mercury Telluride (HgTe) and Mercury Cadmium Telluride (HgCdTe).

16. The method of claim 13 further comprising monitoring the inductance of said first coil and determining said temperature of said piece from said monitored inductance.

17. An apparatus for measuring the temperature of a semiconductor wafer, comprising:

A semiconductor processing tool;

a mount to hold a semiconductor wafer positioned in said semiconductor processing tool;

a first coil positioned in said semiconductor tool to be adjacent to said semiconductor wafer;

electronic apparatus connected to said coil to provide an AC current excitation to said coil and to monitor a inductance of said coil.

18. The apparatus of claim 17 further comprising:

a second coil positioned adjacent to said first coil; and electronic apparatus connected to said second coil for measuring an electromotive force in said second coil.

19. The apparatus of claim 17 further comprising placing a first semiconductor in thermal contact with said semiconductor wafer and adjacent to said first coil.

20. The apparatus of claim 18 further comprising placing a first semiconductor in thermal contact with said semiconductor wafer and adjacent to said first coil and said second coil.

21. The method of claim 20 wherein said first semiconductor is a material from a group consisting of Silicon, Germanium (Ge), Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), AlGaAs, InGaAsP, GaAsP, AlGaN, Zinc Selenide (ZnSe), Zinc Telluride (ZnTe), Cadmium Telluride (CdTe), Zinc Sulphide (ZnS), Mercury Telluride (HgTe) and Mercury Cadmium Telluride (HgCdTe).

22. The method of claim 19 wherein said first semiconductor is a material from a group consisting of Silicon, Germanium (Ge), Gallium Phosphide (GaP), Gallium Arsenide (GaAs), Gallium Antimonide (GaSb), Gallium Nitride (GaN), Indium Phosphide (InP), Indium Arsenide (InAs), Indium Antimonide (InSb), Aluminum Arsenide (AlAs), Aluminum Nitride (AlN), Aluminum Phosphide (AlP), Aluminum Antimonide (AlSb), AlGaAs, InGaAsP, GaAsP, AlGaN, Zinc Selenide (ZnSe), Zinc Telluride (ZnTe), Cadmium Telluride (CdTe), Zinc Sulphide (ZnS), Mercury Telluride (HgTe) and Mercury Cadmium Telluride (HgCdTe).

* * * * *